United States Patent [19]

Wang et al.

[11] Patent Number: 5,023,879
[45] Date of Patent: Jun. 11, 1991

[54] OPTICALLY PUMPED STEP QUANTUM WELL IR SOURCE

[75] Inventors: Kang L. Wang, Santa Monica, Calif.; Perng-Fei Yuh, Ossining, N.Y.

[73] Assignee: The Regents of the University of California, Oakland, Calif.

[21] Appl. No.: 514,853

[22] Filed: Apr. 26, 1990

[51] Int. Cl.$^5$ .................................... H01S 3/19
[52] U.S. Cl. .......................... 372/43; 372/45
[58] Field of Search ............ 372/45, 43, 46, 44, 372/70; 357/16, 17

[56] References Cited

U.S. PATENT DOCUMENTS

| | | | |
|---|---|---|---|
| 4,511,408 | 4/1985 | Holonyak, Jr. ............... | 148/1.5 |
| 4,639,275 | 1/1987 | Holonyak, Jr. ............... | 148/1.5 |
| 4,722,088 | 1/1988 | Wolf .............................. | 372/44 |
| 4,740,978 | 4/1988 | Gobel et al. .................. | 372/50 |
| 4,760,430 | 7/1988 | Coon et al. ................... | 357/16 |
| 4,865,406 | 9/1989 | Khanarian et al. ........... | 350/96 |

Primary Examiner—James W. Davie
Attorney, Agent, or Firm—Henry K. Woodward

[57] ABSTRACT

An optically pumped semiconductor laser comprises multiple asymmetric quantum well structures. Using the structures described herein, the selection rules for additional optical transitions can be made possible and three or four level lasers can be obtained. A population inversion can be achieved by optical pumping for lasing for those not allowed in a simple quantum well.

20 Claims, 2 Drawing Sheets

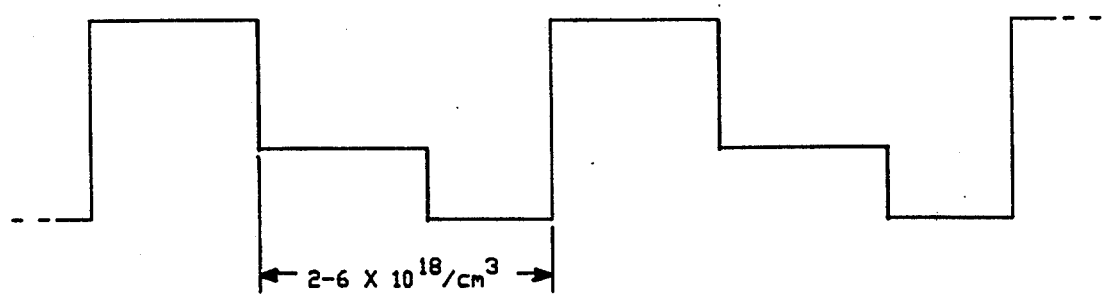
FIG.—2C
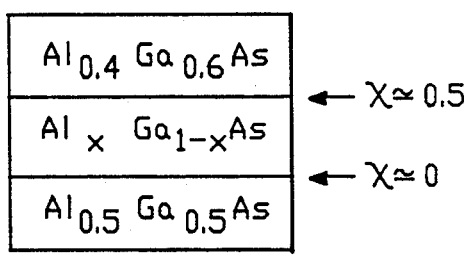
FIG.—3A
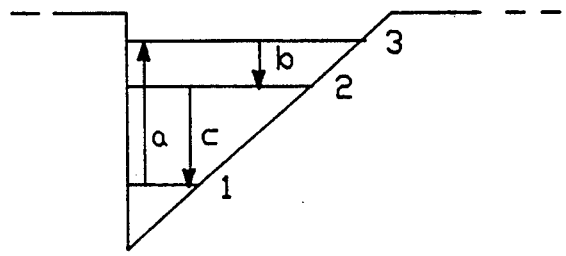
FIG.—3B
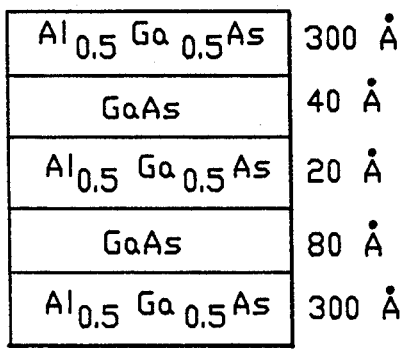
FIG.—4A
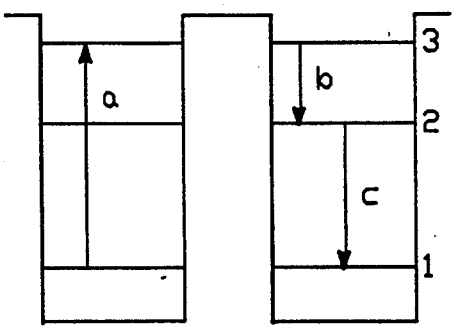
FIG.—4B
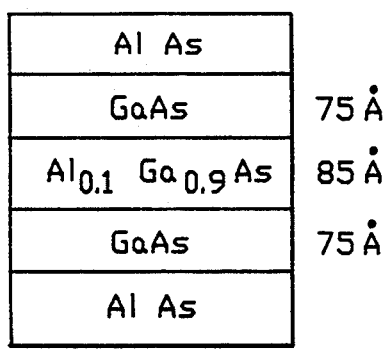
FIG.—5A
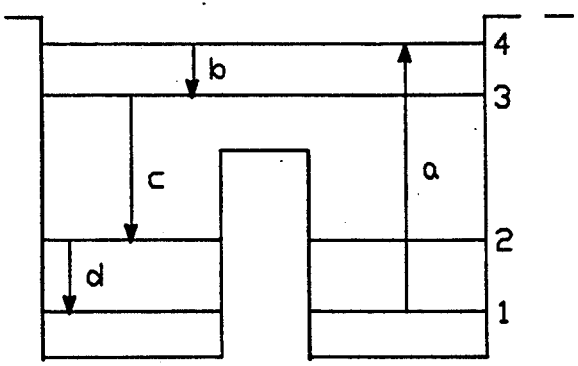
FIG.—5B

OPTICALLY PUMPED STEP QUANTUM WELL IR SOURCE

This invention was made with Government support under Grant No. ARO-DAAL03-K0104 awarded by the U.S. Army Research Office. The government has certain rights in the invention.

BACKGROUND OF THE INVENTION

This invention relates generally to solid state light sources, and more particularly the invention relates to a step quantum well IR source which can be optically pumped.

Optoelectronic devices utilizing intersubband transitions for light emission are known. Typical are heterojunction or tunneling barrier structures. See Coon et al. U.S. Pat. No. 4,760,430, for example, in which a tunneling barrier is used. In the quantum well, electrons are pumped from one energy level to a higher energy level, and as the electrons return to the first energy level, light (photons) are emitted. In a three level laser device, the electrons are pumped up two energy levels, while in the four level laser device electrons are pumped up three energy levels. In both structures, a "population inversion" must exist between two energy levels for lasing or light emission to occur. The "population inversion" is a function of relaxation rate from one energy level to a lower level. Carriers (electrons or holes) must relax out of one energy level to lower level faster than carriers relax into the one energy level.

Coon et al., supra, disclose a tunneling barrier structure which uses current injection and tunneling for population inversion. The tunneling structure is defined by an AlGaAs layer and an undoped GaAs layer between two doped GaAs contact layers. A voltage potential is applied across the multi layer structure which enables the device to generate photon emission.

For a symmetric quantum well, the dipole matrix elements of transitions for odd-to-odd or even-to-even (e.g. 1 to 3 and 2 to 4) quantum numbers vanish, since the envelope functions of these energy states have the same parity due the symmetry of the well. The symmetry of a square quantum well can be broken by applying electric field, and then the normally forbidden transitions are allowed.

SUMMARY OF THE INVENTION

An object of the present invention is a quantum well device which can be optically pumped for generating photon emission.

A feature of the invention is an asymmetric quantum well device which allows optical pumping.

Briefly, an asymmetric or step quantum well in accordance with the invention includes a semiconductor well with a step layer of a different semiconductor material thereon with the well and step layer situated between thicker barrier layers. The well and step can comprise GaAs/AlGaAs, Si/SiGe, or InGaAs/AlInAs, for example. The IR source in accordance with the invention usually has a plurality of stacked quantum wells which can be simultaneously pumped with a single optical source. The quantum well structures allow optical pumping from a ground level to the third or higher energy levels and may have the shape of step, triangular, or even multiple-wells with different width or barrier height.

Considering the lowest three conduction sub levels in the step well, the energy levels are designed such that the energy difference between the highest level (3) and the next highest level (2) ($E_{32}$) is smaller than the longitudinal optical phonon energy ($E_{lo}$) and the energy difference between the second highest energy level (2) and the lowest level (1) is larger than the $E_{lo}$. Since a transition from energy level 1 to energy level 3 is allowed in the step well structure, carriers can be effectively pumped to the third level optically by laser means. The level 3 to level 2 transition has a high radiative recombination rate and a long non-radiative recombination lifetime since $E_{32}$ is less than $E_{lo}$. Conversely, the level 2 to level 1 transition has a relatively short lifetime thus ensuring a net population inversion and a fast depopulation between level 2 and level 1.

The invention and objects and features thereof will be more readily apparent from the following detailed description and appended claims when taken with the drawing.

BRIEF DESCRIPTION OF THE DRAWING

FIGS. 2A–2C illustrate doping profiles for quantum well structures in accordance with the invention.

FIG. 3A is a section view of a triangular well structure in accordance with the invention, and FIG. 3B is a band diagram thereof.

FIG. 4A is a section view of an asymmetric double coupled well structure in accordance with the invention, and FIG. 4B is a band diagram thereof.

FIG. 5A is a section view of a symmetrical coupled well in accordance with the invention, and FIG. 5B is a band diagram thereof.

DETAILED DESCRIPTION OF ILLUSTRATIVE EMBODIMENTS

Figure 1A:
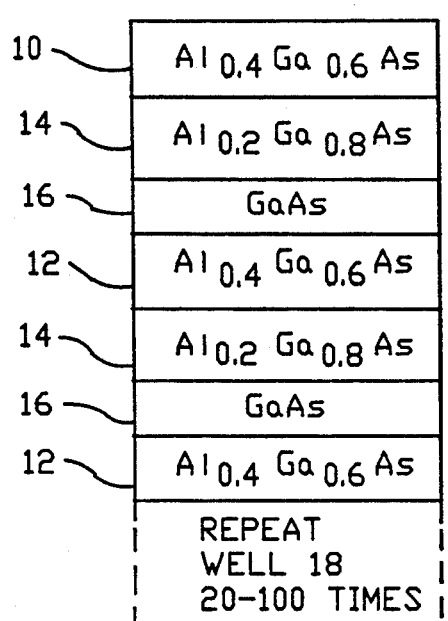
FIG. 1A is a section view of a step quantum well structure in accordance with one embodiment of the invention.

Referring now to the drawing, FIG. 1 is a section view of a light source structure which comprises a plurality of step quantum wells which allows optical pumping in a three level intersubband laser in accordance with one embodiment of the invention. In this embodiment two relatively thick barriers 10 and 12 ($Al_yGa_{1-y}As$) are provided on either side of a step layer 14 ($Al_xGa_{1-x}As$) and a well layer 16. In this embodiment the barrier layers are $Al_{0.4}GA_{0.6}As$, and the step layer is $Al_{0.2}Ga_{0.8}As$, and the well is GaAs. The thickness of the step layer 14 is on the order of 100 angstroms, and the thickness of the well layer 16 is on the order of 50–75 angstroms. The quantum wells 18 including the barrier layers are repeated 20–100 times in the typical structures with all wells being simultaneously pumped with a single optical source, such as a $CO_2$ laser.

The layers are grown by molecular beam epitaxy with the heterojunctions between layers establishing energy levels for the pumping of electrons and the emission of photons as the pumped electrons make the transition from a higher energy level to a lower energy level in the presence of population inversion. The layers are suitably doped with silicon atoms.

Figure 2A:
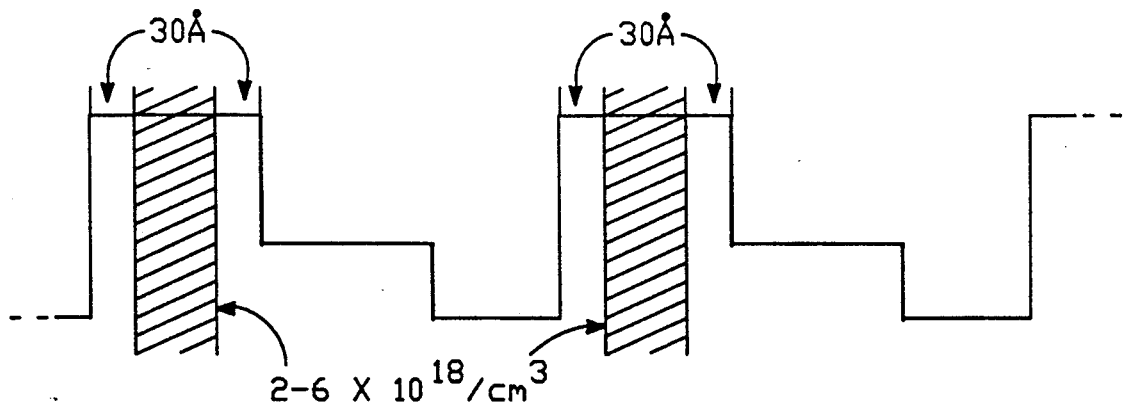
Figure 2B:
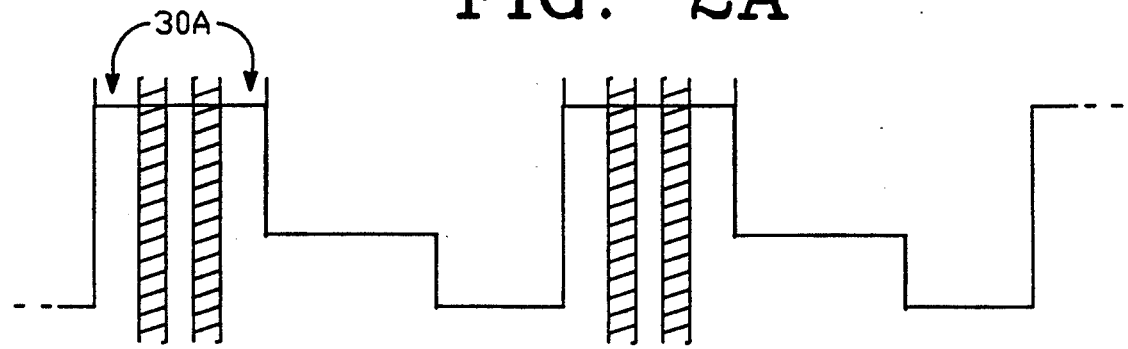

Typical doping profiles for the structure are illustrated in FIG. 2A shows a typical doping in the barrier with Si atoms in the case of (AlGaAs/GaAs material) to 2 to $6 \times 10^{18} cm^3$. There is an undoped space layer of about 30 Å to the step and this modulation doping is known to the art. Other regions are undoped. Other doping profiles are also possible. FIG. 2B illustrates the thin doping layers used for minimizing the band bending effect. FIG. 2C shows that the doping in the well and step is also applicable.

Figure 1B:
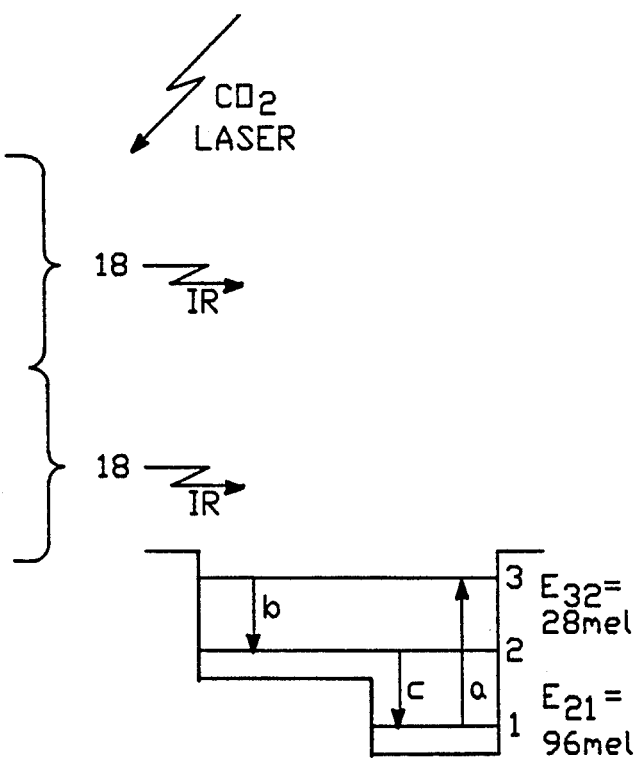
FIG. 1B is a representation of intersubband energy levels in the step quantum well device of FIG. 1.

FIG. 1B is a representation of the three lowest conduction sublevels in each step well. The energy levels are designed such that $E_{31}=124$ mev which can be pumped by a $CO_2$ laser; $E_{32}=28$ mev which is smaller than the longitudinal, optical phonon energy $E_{lo}$ (36 mev for GaAs); and $E_{21}=96$ mev which is larger than $E_{lo}$. The device is doped as described above, and it is assumed that the ground state is occupied while the other higher states are empty in thermal equilibrium. Since the 1 to 3 transition is allowed in this step well structure having an oscillator strength of about 0.4, carriers can now be effectively pumped to the third level by a $CO_2$ laser. The 3 to 2 transition has a large oscillator strength of 1.1, which implies a high radiative recombination rate and a long nonradiative recombination lifetime caused only by acoustic phonon scattering (~300ps) because $E_{32}<E_{lo}$ and the optical phonon scattering is suppressed. Therefore the 3 to 2 transition is efficient for lasing action. The 2 to 1 transition has a very short lifetime caused by optical phonon scattering (~10ps), thus ensuring a fast depopulation of level 2.

The population inversion can be estimated by a simple rate equation, $$\Delta N = N_3 - N_2 = \frac{\left(1 - \frac{\tau_{21}}{\tau_{32}}\right)N}{\left(2 + \frac{\tau_{21}}{\tau_{32}}\right) + \frac{1}{cI}\left(\frac{1}{\tau_{31}} + \frac{1}{\tau_{32}}\right)}, \quad (1)$$

where N is the total population, $N_i$ is the population in level i, $\tau_{ij}$ is the nonradiative lifetime between levels i and j, $R=cI(N_1-N_3)$ is the pump rate of the $CO_2$ laser, I is the laser intensity of and c is a constant proportional to the 1 to 3 oscillator strength. If the laser intensity is high enough, then the population inversion becomes $\Delta N \sim N/2$, since $\tau_{21}/\tau_{32}<0.1$ and for this design $E_{21}>E_{lo}>E_{32}$. If, however, $E_{32}>E_{21}>E_{lo}$, there can still be a population inversion since a larger energy separation usually has a longer lifetime even involving optical phonon scattering.

The described three-level quantum well system is not restricted to the step well structure. FIG. 3 to FIG. 5 show the variations. In FIG. 3A, the step well is replaced with a triangular well, which also forms three energy levels and the ground to third transition is allowed.

In FIG. 4A, two wells of different widths with a thin barrier in between are shown to provide a three-level energy system and work the same principle as in a step well.

In FIG. 5A, a four-level system is formed by symmetrical dual well structures. The allowed 1 to 4 transition provides the pumping mechanism while the 4 to 3 is for the lasing transition to occur. The 3 to 2 and 2 to 1 transitions can be used for depopulation and for another lasing transition, respectively.

FIGS. 3B, 4B, and 5B are band diagrams for the respective well structures in which "a" represents the carrier pumping, "b" represents lasing, and "c" represents depopulation. In FIG. 5B, "c" and "d" can be lasing or depopulation.

There has been described asymmetric and symmetric well laser structures in which a plurality of quantum wells are stacked for simultaneous optical pumping. Each well is defined by two barriers with one or more semiconductor layers therebetween establishing three or more energy levels in which carriers can be optically pumped and which support population inversion between two levels and lasing action in the well. The barriers confine the carriers within the well with minimal tunneling through the barriers. Three level lasers are realized since the selection in the square quantum well which disallows the transition from 1 to 3 is broken in the asymmetric quantum wells and the coupled quantum wells in accordance with the invention.

The described asymmetric three level step quantum well structure permits optical pumping from the ground to third level, while such a three level system is not possible in a symmetric square well structure where the transition from the ground to third or higher levels is forbidden. While the invention has been described with reference to other specific embodiments, the descriptions are illustrative of the invention. For example, the dopant concentrations and layer thicknesses can be varied for laser tuning. Further, other semiconductor quantum well structures, such as SiGe/Si quantum wells can be employed in practicing the invention. Various other modifications and applications may occur to those skilled in the art without departing from the true spirit and scope of the invention as defined by the appended claims.

We claim:

1. A solid state IR source comprising a multi layer semiconductor body including at least a first layer of a first semiconductor material functioning as a well layer, a second layer of a second material on said first layer and functioning as a step, a first barrier layer abutting said first layer, and a second barrier layer abutting said second layer; said first layer, said second layer, and said barrier layers defining three heterojunctions and three energy levels whereby electrons at the lowest level can be optically pumped to the highest energy level and photons are emitted as said electrons transition down to the next highest energy level, said first and second layers creating an electron population inversion between the lowest energy level and said next highest energy level.

2. The solid state IR source as defined by claim 1 wherein said first layer of first semiconductor material comprises GaAs and said second layer of second semiconductor material comprises $Al_xGa_{1-x}As$.

3. The solid state IR source as defined by claim 2 wherein said first layer is GaAs of 70 angstroms thickness and said second layer is $Al_xGa_{1-x}As$ of 120 angstroms thickness.

4. The solid state IR source as defined by claim 3 wherein said first and second barrier layers comprise AlGaAs.

5. The solid state IR source as defined by claim 4 wherein said first and second barrier layers and first and second layers therebetween are repeated a plurality of times to define a plurality of quantum wells.

6. The solid state IR source as defined by claim 1 wherein said first and second barrier layer and first and second layers therebetween are repeated a plurality of times to define a plurality of quantum wells.

7. The solid state IR source as defined by claim 1 wherein said first layer comprises GaAs, said second layer comprises $Al_xGa_{1-x}As$, and said barrier layers comprise $Al_yGa_{1-y}As$.

8. The solid state IR source as defined by claim 1 wherein said first layer comprises silicon and said second layer comprises silicon/germanium.

9. The solid state IR source as defined by claim 1 wherein said first layer comprises InGaAs and said second layer comprises AlInAs.

10. A semiconductor laser comprising a plurality of step quantum wells, each well including
a pair of barrier layers, and
at least two semiconductor layers for creating an intermediate energy level between a high energy level and a ground state energy level; and
means for pumping carriers from said ground state to said high energy level;
whereby laser radiation is provided when said pumped carriers fall from said high energy level to said intermediate energy level.

11. The semiconductor laser as defined by claim 10 wherein said barrier layers comprise $Al_yGa_{1-y}As$, said layers comprising GaAs and $Al_xGa_{1-x}As$.

12. The semiconductor laser as defined by claim 10 wherein said semiconductor layers comprise silicon and silicon/germanium.

13. The semiconductor laser as defined by claim 10 wherein said semiconductor layers comprise InGaAs and AlInAs.

14. The semiconductor laser as defined by claim 10 wherein said two semiconductor layers are selected to create an electron population inversion between said ground state and said intermediate energy level.

15. A semiconductor laser comprising a plurality of triangular quantum wells, each well including a pair of barrier layers and a semiconductor layer therebetween defining the energy levels, whereby an optical source can pump carriers from the lowest energy level to the highest energy level, lasing occurs between the highest energy level and the intermediate energy level, and carrier depopulation occurs between the intermediate energy level and the lowest energy level.

16. The semiconductor laser as defined by claim 15 wherein said barrier layers comprise $Al_{0.5}Ga_{0.5}As$ and said semiconductor layer comprises $Al_xGa_{1-x}As$ where x varies from 0.5 to 0 between said barrier layers.

17. A semiconductor laser comprising a plurality of symmetric double coupled wells, each of said double coupled wells including a pair of barrier layers and three layers of semiconductor material therebetween, said three layers including two layers of the same material but having different thicknesses and a third layer of a different semiconductor material therebetween, whereby said two layers define two wells coupled by said third layer.

18. The semiconductor laser as defined by claim 17 wherein said two layers comprise GaAs and said third layer comprises $Al_{0.5}Ga_{0.5}As$.

19. A semiconductor laser comprising a plurality of symmetric double coupled wells, each of said double coupled wells including a pair of barrier layers and three layers of semiconductor material therebetween, said three layers including two layers of the same material and some thickness and a third layer of different semiconductor material therebetween, whereby said two layers define two wells coupled by said third layer.

20. The semiconductor laser as defined by claim 19 wherein said two layers comprise GaAs and said third layer comprises $Al_{0.1}Ga_{0.9}As.1$.

* * * * *